(12) United States Patent
Gupta et al.

(10) Patent No.: US 10,254,783 B2
(45) Date of Patent: Apr. 9, 2019

(54) EXTERNAL CLOCK BASED CLOCK GENERATOR

(71) Applicant: Western Digital Technologies, Inc., Irvine, CA (US)

(72) Inventors: Nitin Gupta, Noida (IN); Bhavin Odedara, Bangalore (IN); Raghu Voleti, Hyderabad (IN); Srikanth Bojja, Bangalore (IN)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 15/692,877

(22) Filed: Aug. 31, 2017

(65) Prior Publication Data

US 2019/0004562 A1 Jan. 3, 2019

Related U.S. Application Data

(60) Provisional application No. 62/526,063, filed on Jun. 28, 2017.

(51) Int. Cl.
| | |
|---|---|
| *G06F 1/08* | (2006.01) |
| *G06F 1/06* | (2006.01) |
| *G06F 1/10* | (2006.01) |
| *G06F 1/14* | (2006.01) |
| *H03K 3/03* | (2006.01) |
| *H03K 5/159* | (2006.01) |
| *H03K 5/00* | (2006.01) |

(52) U.S. Cl.
CPC ............. *G06F 1/08* (2013.01); *G06F 1/06* (2013.01); *G06F 1/10* (2013.01); *G06F 1/14* (2013.01); *H03K 3/0315* (2013.01); *H03K 5/159* (2013.01); *H03K 2005/00013* (2013.01); *H03K 2005/00104* (2013.01)

(58) Field of Classification Search
CPC ..... G06F 1/08; G06F 1/14; G06F 1/10; G06F 1/06; H03K 5/159; H03K 3/0315; H03K 2005/00013; H03K 2005/00104
USPC ......................................... 327/261, 271, 284
See application file for complete search history.

(56) References Cited

U.S. PATENT DOCUMENTS

| | | | | |
|---|---|---|---|---|
| 6,208,183 | B1 * | 3/2001 | Li ........................... | H03L 7/081 327/158 |
| 8,593,197 | B1 * | 11/2013 | Cheng .................. | H03L 7/0812 327/149 |
| 2002/0171496 | A1 | 11/2002 | Jordan et al. | |

(Continued)

*Primary Examiner* — John W Poos
(74) *Attorney, Agent, or Firm* — Morgan, Lewis & Bockius LLP

(57) ABSTRACT

A clock generation circuit includes a delay chain configured to generate an N-number of clock signals at a frequency multiple that is M-times the frequency of a reference clock signal. To generate the clock signals at the frequency multiple, a multiplexer selectively inputs, to the delay chain, a delayed reference clock signal and a last clock signal generated by a last delay cell of the delay chain. In addition, a delay control generator circuit periodically compares the phases of the delayed reference clock signal and the last clock signal to set the delay of the delay chain. The clock generation circuit generates the N-number of clock signals at the frequency multiple in response to receipt of the reference clock signal, and continues to generate the clock signals at the frequency multiple when the reference clock signal is no longer being received.

17 Claims, 5 Drawing Sheets

(56) References Cited

U.S. PATENT DOCUMENTS

2006/0197567 A1 9/2006 Jakobs et al.
2008/0129342 A1 6/2008 Masleid

* cited by examiner

US 10,254,783 B2

EXTERNAL CLOCK BASED CLOCK GENERATOR

CROSS-REFERENCE TO RELATED APPLICATION

This application claims the benefit of U.S. Provisional Application No. 62/526,063, filed Jun. 28, 2017. The contents of U.S. Provisional Application No. 62/526,063 are incorporated by reference in their entirety.

BACKGROUND

An electronic device that utilizes a clock signal to perform its operation may receive the clock signal from an external source. For example, a memory device may receive a clock signal from a host device. In many situations, the external source sends the clock signal during limited periods, such as only when the external source wants to communicate with the device. However, the electronic device may need to utilize a clock signal at times other than the limited periods that the external source is supplying a clock signal The electronic device may include an internal or on-chip oscillator, such as a crystal oscillator, that generates a clock signal during the periods that a clock signal is not being supplied from the external source. However, an internal oscillator may have certain disadvantages. One disadvantage is that an internal oscillator is costly in terms of the relatively large amount of silicon area that the internal oscillator consumes. Trimming circuitry or a procedure for the internal oscillator may also be needed, further adding to the product cost. Another disadvantage is that when the electronic device switches to using the internal oscillator, the switching may result in time delay as certain circuits, such as phase locked loops (PLL) and delay locked loops (DLL), may require settling time to adjust for the change in clock signal. Added overhead circuitry may be needed to manage this time delay. As such, internal clock generation circuitry that does not consume as much space and that can seamlessly transition to using an internally generated clock signal may be desirable.

BRIEF DESCRIPTION OF THE DRAWINGS

The accompanying drawings, which are incorporated in and constitute a part of this specification illustrate various aspects of the invention and together with the description, serve to explain its principles. Wherever convenient, the same reference numbers will be used throughout the drawings to refer to the same or like elements.

DETAILED DESCRIPTION

Overview

Figure 1:
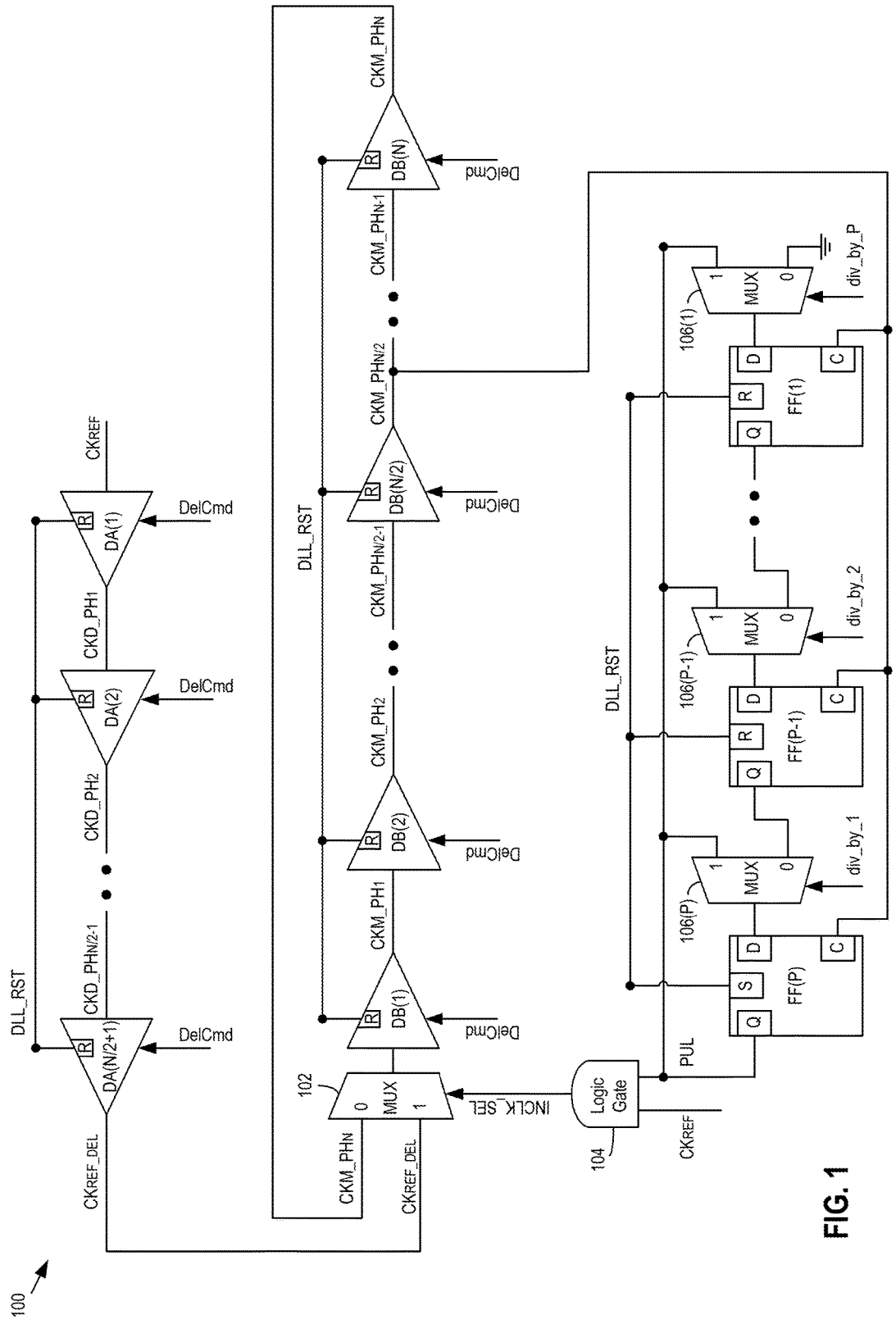
FIG. 1 is a block diagram of an example clock generation circuit.

The present description describes a clock generation circuit includes a delay chain configured to generate an N-number of clock signals at a frequency multiple that is M-times the frequency of a reference clock signal. In one embodiment, a clock generation circuit includes a delay chain configured to: alternatingly receive a delayed reference clock signal and a last clock signal output from the delay chain according to pulses of a select signal; and generate a clock signal at a frequency multiple of a frequency of the delayed reference clock signal in response to alternating receipt of the delayed reference clock signal and the last clock signal.

In some embodiments, the delay chain includes a first delay chain comprising an N-number of delay cells, and the clock generation circuit further includes a second delay chain comprising an (N/2+1)-number of delay cells, where the second delay chain is configured to receive a reference clock signal and generate the delayed reference clock signal in response to receipt of the reference clock signal.

In some embodiments, The clock generation circuit of claim 1, a multiplexer is configured to alternatingly output the delayed reference clock signal and the last clock signal output from the delay chain to a first delay cell of the delay chain according to the pulses of the select signal.

In some embodiments, the multiplexer is further configured to receive the pulses of the select signal at a rate corresponding to once every M-number of cycles of the last clock signal output from the delay chain, where the frequency multiple is M-times the frequency of the delayed reference clock signal.

In some embodiments, the multiplexer is configured to output the delayed reference clock signal to the first delay cell in response to receipt of the pulses, and output the last clock signal to the first delay cell during other times that the pulses are not received.

In some embodiments, a pulse generator is configured to generate the pulses of the select signal at a rate corresponding to once every M-number of cycles, where the frequency multiple is M-times the frequency of the delayed reference clock signal.

In some embodiments, the pulse generator is further configured to receive a reference clock signal, where the delayed reference clock signal is a delayed version of the reference clock signal, and where the pulse generator comprises an output circuit that is configured to prevent the pulse generator from outputting the pulses of the select signal in response to the reference clock signal not being received.

In some embodiments, circuit of claim 6, wherein delay chain includes an N-number of delay cells, and wherein the pulse generator is configured to: receive an (N/2)th clock signal generated with the delay chain; and generate the pulses of the select signal once every Mth cycle of the (N/2)th clock signal.

In some embodiments, a delay control generator is configured to determine a phase delay between the delayed reference clock signal and the last clock signal during comparison windows corresponding to the pulses of the select signal; and generate a delay control signal to set a delay amount of delay cells of the delay chain in response to the determined phase delay.

In another embodiment, a system includes a delay chain and a delay control generator circuit. The delay control generator circuit is configured to determine a phase difference between a delayed reference clock signal and a clock signal output from the delay chain during each of a plurality of comparison windows, where the plurality of comparison windows occur at a rate corresponding to once every M-number of cycles of the clock signal, set a delay control signal in response to the determined phase difference, and output the delay control signal to the delay chain to set a delay of delay cells of the delay chain. In addition, the delay chain is configured to generate the clock signal at a frequency that is M-times the rate of the delayed reference clock signal in response to receipt of the delay control signal.

In some embodiments, the delay chain includes a first delay chain including an N-number of delay cells, and a second delay chain includes a (N/2+1)-number of delay cells, where the second delay chain is configured to receive a reference clock signal and generate the delayed reference clock signal in response to receipt of the clock signal.

In some embodiments, the delay control generator circuit is further configured to output the delay control signal to set a delay of delay cells of the second delay chain.

In some embodiments, a multiplexer is configured to alternatingly output the delayed reference clock signal and the clock signal to a first delay cell of the delay chain according to pulses of a select signal, where the pulses occur at the rate corresponding to once every M-number of cycles of the clock signal.

In some embodiments, the multiplexer is configured to output the delayed reference clock signal to the first delay cell in response to receive of the pulses; and output the clock signal to the first delay cell during other times that the pulses are not received.

In some embodiments, a pulse generator is configured to generate the select signal, where the delay chain includes an N-number of delay cells, where an (N/2) delay cell of the N-number of delay cells is configured to generate an (N/2)th clock signal, and where the pulse generator is configured to generate the pulses of the select signal once every Mth cycle of the (N/2) clock signal.

In another embodiment, an apparatus includes an interface configured to receive an external clock signal at an external clock frequency from an external source, and a delay chain. The delay chain is configured to generate a plurality of clock signals at an initial frequency; in response to receipt of the external clock signal: selectively receive a delayed external clock signal and one of the plurality of clock signals; in response to the selective receipt, adjust a frequency of the plurality of clock signals from the initial frequency to a frequency multiple of the external clock frequency; and continue to generate the plurality of clock signals at the frequency multiple of the external clock frequency in response to the interface no longer receiving the external clock signal.

In some embodiments, the initial frequency matches a frequency of the delayed external clock signal.

In some embodiments, a multiplexer is configured to: receive the delayed external clock signal and the one of the plurality of clock signals; receive a select signal including pulses occurring at a rate corresponding to once every M-number of cycles of the plurality of clock signals; output the delayed external clock signal to the delay chain in response to receipt of the pulses; and output the one of the plurality of clock signals to the delay chain during other times that the pulses are not received.

In some embodiments, the delay chain includes a first delay chain including an N-number of delay cells, and a second delay chain includes an (N/2+1)-number of delay cells, where a first delay cell of the (N/2+1)-number of delay cells is configured to receive the external clock signal, and where a (N/2+1)th delay cell of the (N/2+1)-number of delay cells is configured to output the delayed external clock signal to the multiplexer.

In some embodiments, a delay control generator circuit is configured to determine a phase difference between the delayed external clock signal and the one of the plurality of clock signals during each a plurality of comparison windows, where the plurality of comparison windows occur at a rate corresponding to once every M-number of cycles of the plurality of clock signals.

Other embodiments are possible, and each of the embodiments can be used alone or together in combination. Accordingly, various embodiments will now be described with reference to the attached drawings.

Embodiments

FIG. 1 is a block diagram of an example clock generation circuit or circuit system 100 that is configured to generate an N-number of clock signals $CKM\_PH_1$ to $CKM\_PH_N$ at a frequency or clock rate that is M-times the frequency or rate of a reference clock signal $CK_{REF}$. The clock generation circuit 100 may include a first delay chain circuit that includes an N-number of delay circuit cells or blocks DB(1) to DB(N). For some example configurations, each delay cell DB(1) to DB(N) may be a buffer circuit, although other configurations may be possible. The number N may be an integer greater than one. The number M may be an integer greater than or equal to 1.

In the first delay chain, the output of one delay cell may be coupled to the input of a next or adjacent delay cell of the first delay chain. As used herein, two delay cells of a delay chain are adjacent to each other if the output of one delay cell is coupled to the input of the other delay cell, and there are no other delay cells in between the output of the one delay cell and the input of the other delay cell. Also, the output of one delay cell may be coupled to the input of another delay cell by either being directly coupled or indirectly coupled. One way that an output of one delay cell can be indirectly coupled to the input of another delay cell is that one or more components may be disposed in between the two delay cells. As described in further detail below, an example component may be a multiplexer. Also, for a given pair of adjacent delay cells, the delay cell that has its input coupled to the output of the other may be referred to as a next delay cell, and the other delay cell that has its output coupled to the other's input may be referred to as the prior delay cell. So, for example, the first and second delay cells DB(1), DB(2) may be adjacent delay cells, with the second delay cell DB(2) being the next delay cell since its input is coupled to the output of the first delay cell DB(1).

In addition, in the first delay chain, each of the delay cells DB(1) to DB(N) may be configured to generate and output a respective one of the clock signals $CKM\_PH_1$ to $CKM\_PH_N$. Also, each of the delay cells DB(1) to DB(N) may be configured to send the clock signal that it generates to a next delay cell of the first delay chain. Accordingly, except for certain times with respect to the first delay cell DB(1) as described in further detail below, each of the delay cells DB(1) to DB(N) may be configured to receive the clock signal generated by its prior delay cell, and generate its clock signal based on the clock signal it receives. For clarity, the clock signal that a given ith delay cell DB(i) receives is referred to as the input clock signal of the ith delay cell DB(i) and the clock signal that the given ith delay cell DB(i) generates and outputs is referred to as the output clock signal of the ith delay cell DB(i).

Each of the delay cells DB(1) to DB(N) may be configured with a certain amount of delay by which to delay its respective input clock signal in order to generate its respective output clock signal. Otherwise stated, an ith clock signal CKM_PH$_i$ output by an ith delay cell DB(i) is a delayed version of the input clock signal that the ith delay cell DB(i) receives, and the amount of the delay is the delay by which the ith delay cell DB(i) is configured to delay its input clock signal.

By delaying their respective input clock signals, each of the delay cells DB(1) to DB(N) may be configured to phase shift their respective input clock signals by a phase amount proportional and/or corresponding to the delay with which it is configured. Otherwise stated, an ith clock signal CKM_PH$_i$ output by an ith delay cell DB(i) is a phase shifted version of the input clock signal that the ith delay cell DB(i) receives, and the amount of the phase shift corresponds to the delay by which the ith delay cell DB(i) is configured to delay its input clock signal.

Figure 2:
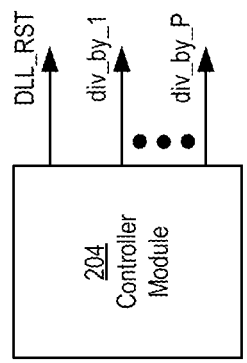
FIG. 2 is a block diagram of a delay control generator and a controller that control operation of the example clock generation circuit of FIG. 1.
Figure 2:
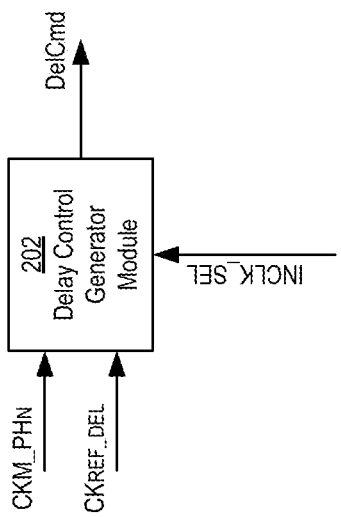

In addition, the delay cells DB(1) to DB(N) may be programmable, meaning that the amount of delay that each of the delay cells DB(1) to DB(N) is configured with may be adjustable. Referring to FIG. 2, a delay control generator module 202 may be configured to generate and output a delay control signal DelCmd to each of the delay cells DB(1) to DB(N) to set the delay for each of the delay cells DB(1) to DB(N). The delay control generator module 202 may be considered a component of the clock generation circuit 100 or may be considered be separate from, in communication with, and/or form a system with the clock generation circuit 100. In addition, in general, as used herein, a module may be hardware or a combination of hardware and software. For example, a module may include an application specific integrated circuit (ASIC), a field programmable gate array (FPGA), a circuit, a digital logic circuit, an analog circuit, a combination of discrete circuits, gates, or any other type of hardware or combination thereof. In addition or alternatively, a module may include memory hardware that comprises instructions executable with a processor or processor circuitry to implement one or more of the features of the module. When a module includes the portion of the memory that comprises instructions executable with the processor, the module may or may not include the processor. In some examples, a module may just be the portion of the memory that comprises instructions executable with the processor to implement the features of the corresponding module without the module including any other hardware. Because a module includes at least some hardware even when the included hardware comprises software, a module may be interchangeably referred to as a hardware module.

For some example configurations, the delay control signal DelCmd may be a K-bit digital signal, and the digital value of the K-bit digital signal (K being an integer) may determine the amount of the delay. In this sense, each of the delay cells DB(1) to DB(N) may be digitally programmable. For other example configurations, the delay control signal may be generated at an analog voltage level, with the level determining the amount of the delay.

Referring back to FIG. 1, the control generation circuit 100 may further include an input multiplexer (MUX) 102 that functions as an input circuit of the first delay chain circuit. As shown in FIG. 1, the output of the input multiplexer 102 may be coupled to the input of the first delay cell DB(1) such that the output signal of the input multiplexer 102 is the input signal of the first delay cell DB(1). A first input of the input multiplexer 102 may be coupled to the output of the Nth or last delay cell DB(N) and be configured to receive the Nth clock signal CKM_PH$_N$ generated by the Nth delay cell DB(N). A second input of the input multiplexer 102 may be coupled to an output of a second delay chain and configured to receive a delayed reference clock signal CK$_{REF\_DEL}$ output from the second delay chain. The second delay chain is described in further detail below.

The input multiplexer 102 may be configured to selectively or alternatingly output either the Nth clock signal CKM_PH$_N$ or the delayed reference clock signal CK$_{REF\_DEL}$ to the input of the first delay chain—i.e., to the input of the first delay cell DB(1). Accordingly, first delay chain may be configured to selectively or alternatingly receive, from the input multiplexer, either the Nth clock signal CKM_PH$_N$ or the delayed reference clock signal CK$_{REF\_DEL}$.

The input multiplexer 102 may be configured to select whether to output the Nth clock signal CKM_PH$_N$ or the delayed reference clock signal CK$_{REF\_DEL}$ in response receipt of a clock select signal INCLK_SEL received at a select input of the input multiplexer 102. The clock select signal INCLK_SEL may be generated at a high level or a low level, with the high level being higher in magnitude than the low level. The input multiplexer 102 may be configured to output either the Nth clock signal CKM_PH$_N$ or the delayed input clock signal CK$_{REF\_DEL}$ based on whether the clock select signal INCLK_SEL is at the high level or the low level. In a particular example configuration, as shown in FIG. 1, the first input of the input multiplexer 102 may be a "0" or low input and the second input of the multiplexer 102 may be a "1" or high input. The high level of the clock select signal INCLK_SEL may correspond to the "1" input and the low level of the clock signal INCLK_SEL may correspond to the "0" input. Accordingly, the input multiplexer 102 may be configured to output the delayed reference clock signal CK$_{REF\_DEL}$ as its output signal in response to the clock select signal INCLK_SEL being at the high level, and output the Nth clock signal CKM_PH$_N$ as its output signal in response to the clock select signal INCLK_SEL being at the low level.

The second delay chain circuit may include an (N/2+1)-number of delay cells DA(1) to DA(N/2+1). Similar to the first delay chain, the output of one delay cell may be coupled to the input of a next or adjacent delay cell. Each of the delay cells DA(1) to DA(N/2+1) may be configured to generate and output a respective one of a plurality of intermediate delayed reference clock signals CKD_PH$_1$ to CKD_PH$_{N/2-1}$. Also, except for the last delay cell DA(N/2+1), each of the delay cells DA(1) to DA(N/2) may be configured to send the clock signal that it generates to a next delay cell of the second delay chain. Accordingly, except for the first delay cell DN(1) and the last delay cell DA(N/2+1), each of the delay cells DA(1) to DA(N/2) may be configured to receive the clock signal generated by its prior delay cell, and generate its clock signal based on the clock signal it receives. The last delay cell DA(N/2+1) may be configured to generate the delayed reference clock signal CK$_{REF\_DEL}$ and output the delayed reference clock signal CK$_{REF\_DEL}$ to the input multiplexer 102.

The first delay cell DA(1) of the second chain may be configured to receive a reference clock signal CK$_{REF}$. The reference clock signal CK$_{REF}$, also referred to as an external clock signal, is a clock signal that is generated and/or output by an external source that is external to the clock generation circuit 100 and is used as a reference for generation of the clock signals $CKM\_PH_1$ to $CKM\_PH_{N-1}$. As described in further detail below, the first delay chain may be configured to generate the clock signals $CKM\_PH_1$ to $CKM\_PH_{N-1}$ at a frequency that is M-times the frequency of the reference clock signal $CK_{REF}$ in response to receipt of the reference clock signal $CK_{REF}$ received by the second delay chain. Further, when the second delay chain stops receiving the reference clock signal $CK_{REF}$, the first delay chain may continue to generate the clock signals $CKM\_PH_1$ to $CKM\_PH_{N-1}$.

In addition, like the delay cells DB(1) to DB(N), each of the delay cells DA(1) to DA(N/2+1) may be configured with a certain amount of delay by which to delay its respective input clock signal in order to generate its respective output clock signal. By delaying their respective input clock signals, each of the delay cells DA(1) to DA(N/2+1) may be configured to phase shift their respective input clock signals by a phase amount proportional and/or corresponding to the delay with which it is configured. Otherwise stated, an ith clock signal $CKD\_PH_i$ output by an ith delay cell DA(i) is a phase shifted version of the input clock signal that the ith delay cell DA(i) receives, and the amount of the phase shift corresponds to the delay by which the ith delay cell DA(i) is configured to delay its input clock signal. Further, like the delay cells DB(1) to DB(N) of the first delay chain, the delay cells DA(1) to DA(N/2+1) may be programmable, and their respective delays may be set with the delay control signal DelCmd.

In addition, as previously described, two adjacent delay cells may be coupled to each other by being either directly coupled or indirectly coupled to each other. For some example configurations, although not shown in the drawings, adjacent delay cells in the first delay chain and/or adjacent cells of the second delay chain are indirectly coupled to each other in that a multiplexer may be disposed in between each adjacent pair of delay cells. A multiplexer may also be disposed at the input of the first delay cell DA(1) of the second delay chain such that the reference clock signal $CK_{REF}$ passes through the multiplexer before being received by the first delay cell DA(1). Each of these multiplexers may have one input configured to receive an output clock signal from one delay cell of a given pair of adjacent delay cells, a second input coupled to ground, and a select input also coupled to ground. In this configuration, each of the multiplexers is configured to output the clock signal it receives at its first input to the input of the other delay cell of the given pair of adjacent delay cells. The input multiplexer 102 may inherently provide a certain amount of delay. In turn, the combination of the input multiplexer 102 and the first delay cell DB(1) of the first delay chain may provide an effective or total amount of delay that is the sum of the delay provided by the input multiplexer 102 and the delay provided by the first delay cell DB(1). The other multiplexers disposed in between the adjacent delay cells and in front of the first delay cell DA(1) of the second delay chain may be similarly configured as the input multiplexer 102 such that they provide the same or about the same amount of delay as the input multiplexer 102. As a result, each delay cell may have an associated effective or combined delay that is the sum of its delay and the delay provided by a multiplexer coupled to its input. In turn, the delay added to the first delay cell DB(1) of the first delay chain by the input multiplexer 102 is offset or compensated for by the disposal of the multiplexers in between adjacent delay cells and in front of the first delay cell DA(1), such that each delay cell of the first delay chain and/or the second delay chain has the same effective or combined delay.

The clock generation circuit 100 may further include a pulse generator circuit that is configured to generate and output the clock select signal INCLK_SEL when the clock generation circuit 100 is receiving the reference clock signal $CK_{REF}$. The clock select signal INCLK_SEL is a pulse signal with pulses occurring once every M cycles of the clock signals $CKM\_PH_1$ to $CKM\_PH_N$. As previously described, the number M may be the number of times faster that the frequency or clock rate of the clock signals $CKM\_PH_1$ to $CKM\_PH_N$ than the frequency or rate of the reference clock signal $CK_{REF}$. As described in further detail below, outputting the clock select signal INCLK_SEL as a pulse signal with pulses occurring once every M cycles of the clock signals $CKM\_PH_1$ to $CKM\_PH_N$ may cause the first delay chain to generate the clock signals $CKM\_PH_1$ to $CKM\_PH_N$ at a frequency that transitions from an initial frequency value to a frequency multiple of the frequency of the reference clock signal $CK_{REF}$, the frequency multiple being M-times the frequency of the reference clock signal $CK_{REF}$.

For some example configurations, the pulse generator circuit may be implemented as a ring counter circuit that includes a P-number of flip flops FF(1) to FF(P). As shown in FIG. 1, the (N/2)th clock signal $CKM\_PH_{N/2}$ generated in the first delay chain may be supplied to the clock inputs of each of the flip flops FF(1) to FF(P) so that the flip flops FF(1) FF(P) operate on the edges, such as the rising edges, of the (N/2)th clock signal $CKM\_PH_{N/2}$. The output of the ring counter circuit may generate a pulse signal PUL with pulses occurring once every M cycles of the (N/2)th clock signal $CKM\_PH_{N/2}$. Using the (N/2)th clock signal $CKM\_PH_{N/2}$ for timing, the ring counter may be configured to count to M, and output a pulse of the pulse signal PUL each time it reaches M. Each pulse of the pulse signal PUL may have a pulse width or pulse duration that lasts about one period of the (N/2)th clock signal $CM\_PH_{N/2}$ The pulse generator circuit may further include an output logic gate circuit 104, such as an AND logic gate circuit, configured at the pulse generator circuit's output that allows or does not allow the pulse signal PUL to be supplied as the clock select signal INCLK_SEL to the input multiplexer 102 depending on whether the clock generation circuit 100 is receiving the reference clock signal $CK_{REF}$. In particular, the gating circuit 104 may be configured to output the pulse signal PUL as the clock select signal INCLK_SEL to the input multiplexer 102 when the reference clock signal $CK_{REF}$ is being received. Alternatively, when the reference clock signal $CK_{REF}$ is not being received, the logic gate circuit 104 may prevent the pulse signal PUL from being supplied as the clock select signal INCLK_SEL to the input multiplexer 102. Otherwise stated, due to including the logic gate 104 at the output of pulse generator circuit, the pulse generator circuit may output the pulses of the clock select signal INCLK_SEL only in response to receipt of the reference clock signal $CK_{REF}$. Accordingly, as shown in FIG. 1, the logic gate 104 may include a first input configured to receive the pulse signal PUL, a second input configured to receive the reference clock signal $CK_{IN}$, and an output configured to supply the clock select signal INCLK_SEL to the input multiplexer 102.

As previously described, the input multiplexer 102 may be configured to output the delayed reference clock signal $CK_{REF\_DEL}$ as its output signal in response to the clock select signal INCLK_SEL being at the high level, and output the Nth clock signal $CKM\_PH_N$ as its output signal in response to the clock select signal INCLK_SEL being at the low level. The portions of the clock select signal INCLK- _SEL that constitute the pulses of the clock select signal INCLK_SEL may correspond to the high or logic "1" level of the clock select signal INCLK_SEL, and other portions of the clock select signal INCLK_SEL that do not constitute the pulses may correspond to the low or logic "0" level of the clock select signal INCLK_SEL. Accordingly, the input multiplexer 102 may be configured to output the delayed reference clock signal $CK_{REF}$ to the first delay cell DB(1) in response to receipt of and/or when the input multiplexer 102 is receiving the pulses of the clock select signal INCLK_SEL (which occur once every M pulses of the (N/2)th clock signal $CKM\_PH_{N/2}$), and is further configured to output the Nth clock signal $CKM\_PH_N$ during the other times or (M−1) out of M cycles of the (N/2)th clock signal $CKM\_PH_{N/2}$ when the input multiplexer 102 is not receiving the pulses.

For some example configurations, the ring counter may be non-programmable. For these example configurations, the number M may be a fixed or non-adjustable number, and the number P may be equal to the number M. That is, the P (or M) number of flip flops FF(1) to FF(P) may be configured to fixedly or statically generate a pulse once every M-number of cycles of the (N/2)th clock signal $CKM\_PH_{N/2}$.

For other example configurations, such as the one shown in FIG. 1, the ring counter may be programmable, such that the number M may be a dynamic or variable number that can be set and/or adjusted. In order to be programmable, the ring counter may include a P-number of input multiplexers (MUX) 106(1) to 106(P), each associated with a respective one of the P-number of flip-flops FF(1) to FF(P). The output of each input multiplexer 106(1) to 106(P) may be coupled to a respective input, such as a D input, of an associated one of the flip flops FF(1) to FF(P).

Each flip flop FF(1) to FF(P) may be configured to output its output signal at its Q output. Except for the Pth or last flip flop FF(P), the flip flops FF(1) to FF(P−1) may be configured to output their respective output signals to the "0" input of a next input multiplexer 106. That is, a given ith flip flop FF(i) may be configured to output its output signal to the "0" input of a next (i+1) input multiplexer 106(i+1). The pulse signal PUL may be the output signal of the Pth or last flip flop FF(P). In addition to being output to the logic gate 104, the pulse signal PUL may be output or supplied to the "1" input of each of the input multiplexers 106(1) to 106(P). The "0" input of the first input multiplexer 106(1) may be coupled to ground.

Referring again to FIG. 2, a controller module 204 may be configured to supply respective divide-by-M control signals div_by_P to div_by_1 to the input multiplexers 106(1) to 106(P) to control when the ring oscillator outputs a pulse of the pulse signal PUL. In particular, the controller 204 may be configured to determine the integer value for M, which is herein referred to as an M-value. Possible M-values may be in a range from 1 to P. In response to determination of the M-value, the controller 204 may be configured to set the divide-by-M control signal that corresponds to the determined M-value to a high level, and the other, non-corresponding divide-by-M controls signals to a low level. Similar to the delay control generator 202, the controller 204 may be considered a component of the clock generation circuit 100 or may be considered be separate from, in communication with, and/or form a system with the clock generation circuit 100.

For purposes of the present description and as used in the labeling with respect to the drawings, which divide-by-M control signal div_by_P to div_by_1 corresponds to which M-value is determined or indicated by the number appended to the end of the "div_by_" label. So, for example, a first divide-by-M control signal div_by_1 corresponds to an M-value of 1 (i.e., M=1), a second divide-by-M control signal div_by_2 control signal corresponds to an M-value of 2 (i.e., M=2), a Pth divide-by-M control signal div_by_P corresponds to an M-value of P (i.e., M=P), and so on. Accordingly, as examples, if the controller 204 determines for the ring counter to output a pulse of the pulse signal PUL every cycle of the (N/2)th clock signal $CKM\_PHN_{N/2}$, the controller 204 may set the first divide-by-M control signal div_by 1 to a high level and the other divide-by-M control signals div_by 2 to div_by_P each to a low level; if the controller 204 determines for the ring counter to output a pulse of the pulse signal PUL once every other cycle or every two cycles of the (N/2)th clock signal $CKM\_PH_{N/2}$, the controller 204 may set the second divide-by-M control signal div_by 2 to a high level and the other divide-by-M control signals div_by 1 and div_by_3 to div_by_P each to a low level; and if the controller 204 determines for the ring counter to output a pulse of the pulse signal PUL once every Pth cycle of the (N/2) clock signal $CKM\_PH_{N/2}$, the controller 204 may set the Pth divide-by-M control signal div_by_P to a high level and the other divide-by-M control signals div_by 1 to div_by_P−1 each to a low level.

Referring to both FIGS. 1 and 2, the controller 204 may supply each of the divide-by-M control signals div_by_P to div_by_1 to a respective one of the input multiplexers 106(1) to 106(P). In accordance with the configuration of the example programmable ring oscillator of FIG. 1, the divide-by-M control signals div_by_P to div_by_1 may be supplied to the input multiplexers 106(1) to 106(P) in a reverse order, meaning that the first divide-by-M control signal div_by 1 is supplied to the Pth or last input multiplexer 106(P), the second divide-by-M control signal div_by 2 is supplied to the (P−1)th or second-to-last input multiplexer 106(P−1), the Pth divide-by-M control signal div_by_P is supplied to the first input multiplexer 106(1), and so on.

Also, as shown in FIG. 1, a reset or clear input "R" of the non-last flip flops FF(1) to FF(P−1) and a set or preset input "S" of the last flip flop FF(P) may be configured to receive a reset signal DLL_RST from the controller 204. Before the ring counter operates or during periods where the ring counter is not to operate, the controller 204 may hold the ring counter in a reset state by setting the reset signal DLL_RST to a high level. In response, the non-last flip flops FF(1) to FF(P−1) may generate and hold their respective Q outputs at low levels and the Pth or last flip flop FF(P) may generate and hold its respective Q output at a high level. Alternatively, during periods of operation, the controller 204 may output the reset signal DLL_RST at a low level, which in turn may allow the ring counter to perform its counting operation and output a pulse of the pulse signal PUL once every Mth cycle of the (N/2)th clock signals $CKM\_PH_{N/2}$. Also, as shown in FIG. 1, the controller 204 may be configured to supply the reset signal DLL_RST to reset inputs of the delay cells DB(1) to DB(N) of the first delay chain and delay cells DA(1) to DA(N/2+1) of the second delay chain to hold them in reset states during periods where the first and second delay chains are not to operate.

During an initial, idle period of operation, the clock generation circuit 100 may be considered to enter into and be in an initial or idle state or phase of operation. During this initial, idle state, the clock generation circuit 100 has not yet received the reference clock signal $CK_{REF}$, and in response, the first delay chain may not be generating the clock signals $CKM\_PH_1$ to $CKM\_PH_N$. Without receipt of the reference clock signal $CK_{REF}$, the logic gate 104 may output the clock select signal INCLK_SEL at a low level, causing the input multiplexer 102 to output the input multiplexer 102 to provide the Nth clock signal $CKM\_PH_N$ as the input clock signal to the first delay cell DB(1). In some example configurations, during this initial period, the delay control generator 202 may be configured to output the delay control signal DelCmd at an initial, predetermined, or default value or level to the delay cells DB(1) to DB(N) of the first delay chain and the delay cells DA(1) to DA(N/2+1) of the second delay chain. Also, during the initial period of operation, the controller 204 may have determined the M-value and set the divide-by-M control signals div_by_1 to div_by_P to appropriate levels corresponding to the determined M-value.

At the end of an initial period of operation, the clock generation circuit 100 may initially receive the reference clock signal $CK_{REF}$, which may denote or mark the beginning of a frequency-adjustment state or phase of operation At the start of the frequency-adjustment phase, in response to initial receipt of the delayed reference clock signal $CK_{REF}$, the first delay chain may initially generate the clock signals $CKM\_PH_1$ to $CKM\_PH_N$ at an initial frequency that matches the frequency of the reference clock signal $CK_{REF}$ and the delayed reference clock signal $CK_{REF}$. As the frequency-adjustment phase progresses, the first delay chain may respond to changes in the level or value of the delay control signal DelCmd by adjusting the frequency of the clock signals $CKM\_PH_1$ to $CKM\_PH_N$ from the initial frequency until the frequency reaches a frequency multiple that is M-times the frequency of the reference clock signal $CK_{REF}$.

In further detail, the first delay cell DA(1) of the second delay chain and the logic gate 104 may begin receiving the clock signal $CK_{REF}$. The respective pulses of the reference clock signal $CK_{REF}$ and the pulse signal PUL, both in terms of timing and magnitude, may be such that the reference clock signal $CK_{REF}$ is at a high level during the pulses of the pulse signal PUL, and so the waveform of the clock select signal INCLK_SEL matches or tracks the waveform of the pulse signal PUL. Accordingly, while the logic gate 104 is receiving the reference clock signal $CK_{REF}$, the clock select signal INCLK_SEL may be a pulse sequence of pulses that occur once every M cycles of the (N/2) clock signal $CKM\_PH_{N/2}$.

Also, upon receipt of the reference clock signal $CK_{REF}$, the second delay chain may output the delayed reference clock signal $CK_{REF}$ to the input multiplexer 102. In addition to receiving the delayed reference clock signal $CK_{REF}$, the input multiplexer 102 may receive the clock select signal INCLK_SEL. The input multiplexer 102 may respond to each pulse of the clock select signal INCLK_SEL by outputting the delayed reference clock signal $CK_{REF\_DEL}$ to the first delay cell DB(1) instead of the Nth clock signal $CKM\_PH_N$. Accordingly, during every Mth cycle of the (N/2)th clock signal $CKM\_PH_{N/2}$, the input multiplexer 102 inputs or injects the delayed reference clock signal $CK_{REF\_DEL}$ into the first delay chain. Conversely, during the other (M−1) of every M cycles of the (N/2)th clock signal $CKM\_PH_{N/2}$, the output clock signal $CKM\_PH_N$ of the Nth (last) delay cell DB(N) is fed back and input into the beginning of the first delay chain—i.e., to the first delay cell DB(1).

The period of time that a pulse of the clock select signal INCLK_SEL is being received by the input multiplexer 102 and the input multiplexer 102 is outputting the delayed reference clock signal $CK_{REF\_DEL}$ instead of the Nth clock signal $CKM\_PH_N$ is referred to herein as a comparison window. The comparison windows occur at a rate corresponding to once every M-number of cycles of the clock signals $CKM\_PH_1$ to $CKM\_PH_N$. In particular, the comparison windows occur once every M-number of cycles of the (N/2)th clock signal $CKM\_PH_{N/2}$. Referring particularly to FIG. 2, the delay control generator 202 may be configured to receive both the Nth clock signal $CKM\_PH_N$ and the delayed reference clock signal $CK_{REF\_DEL}$. During the comparison window, the delay control generator 202 may be configured to determine a phase difference between the Nth $CKM\_PH_N$ and the delayed reference clock signal $CK_{REF\_DEL}$. The delay control generator 202 may be configured to determine or measure the phase difference between the Nth $CKM\_PH_N$ and the delayed reference clock signal $CK_{REF\_DEL}$ with respect to their rising edges, their falling edges, or a combination thereof.

In response to the comparison, the delay control generator 202 may be configured to set the delay control signal DelCmd to a value or level corresponding to the phase difference. If, based on the comparison, the delay control generator 202 determines that the delay control signal DelCmd should be set to a different value or level than its current value or level, then the delay control generator 202 may be configured to adjust the delay control signal DelCmd to the different value or level. The delay control generator 202 may then identify that different value or level as the current value or level. The purpose of the adjustment in the level or value of the delay control signal DelCmd is for the phase difference between the Nth clock signal $CLK\_PH_N$ and the delay reference clock signal $CK_{REF\_DEL}$ to be smaller during a next comparison window, and for the delay control generator 202 to eventually identify no phase difference between the Nth clock signal $CLK\_PH_N$ and the delay reference clock signal $CK_{REF\_DEL}$. The effect of the adjustment in the value of level of the delay control signal DelCmd is that the delay of the delay cells DB(1) to DB(N) will change, which in turn will cause the frequency at which the delay cells DB(1) to DB(N) are generating the clock signals $CKM\_PH_1$ to $CKM\_PH_N$ to correspondingly change their frequencies or rates.

As shown in FIG. 2, for some example configurations, the delay control generator 202 may be configured to receive the clock select signal INCLK_SEL to identify when the comparison windows occur. For example, the delay control generator 202 may be configured to identify a rising edge of the clock select signal INCLK_SEL, indicating that the comparison window as started, and also to identify a falling edge of the clock select signal INCLK_SEL, indicating that the comparison window has ended. If the delay control generator 202 determines to adjust the delay control signal DelCmd to a different value or level, the delay control generator 202 may output the delay control signal DelCmd at the different value or level on the falling edge of the clock select signal INCLK_SEL.

Referring back to FIG. 1, for a single pass through the first delay chain, the first delay chain delays the input signal (i.e., the output signal of the input multiplexer 102) by a delay amount corresponding to the value or level of the delay control signal DelCmd an N-number of times, as previously described. In addition, for a single pass through the second delay chain, the second delay chain delays the clock reference signal $CK_{REF}$ by the delay amount corresponding to the value or level for the delay control signal DelCmd an (N/2+1)-number of times to generate the delayed reference clock signal $CK_{REF\_DEL}$. Since the first and second delay chains receive the same delay control command signal DelCmd, the delay cells DB(1) to DB(N) of the first delay chain and the delay cells DA(1) to DA(N/2+1) provide the same proportional amount of delay (notwithstanding variations due to process-voltage-temperature (PVT) conditions) at a given point in time during operation. With the input multiplexer 102 inputting the delayed reference clock signal $CK_{REF}$ once every Mth clock cycle and inputting the Nth clock signal $CKM\_PH_N$ every other (M−1) of M clock cycles of the (N/2)th clock signal $CKM\_PH_{N/2}$, and while adjusting the delay of the delay cells DB(1) to DB(N) in response to measuring the phase difference between the Nth clock signal $CKM\_PH_N$ and the delayed reference clock signal $CK_{REF\_DEL}$ during the comparison window (i.e., during the time period that the delayed reference clock signal $CK_{REF\_DEL}$ is input into the first delay chain), the delay cells DB(1) to DB(N) of the first delay chain may adjust the frequency of the clock signals $CKM\_PH_1$ to $CKM\_PH_N$ from the initial frequency to a frequency that is M-times the frequency of the reference clock signal $CK_{REF}$. That is, when the frequency of the clock signals $CKM\_PH_1$ to $CKM\_PH_N$ is M-times the frequency of the reference clock signal $CK_{REF}$, the edges of the delayed reference clock signal $CK_{REF\_DEL}$ and the Nth clock signal $CKM\_PH_N$ may be aligned. The delayed reference clock signal $CK_{REF\_DEL}$ and the Nth clock signal $CKM\_PH_N$ may be in phase with each other.

At this point, the first delay chain may be in a locked state in that the frequency at which the delay cells DB(1) to DB(N) are generating the clock signals $CKM\_PH_1$ to $CKM\_PH_N$ is locked or is constant at M-times the frequency of the reference clock signal $CK_{REF}$. When the first delay chain is in the locked state and the delay cells DB(1) to DB(N) are generating the clock signals $CKM\_PH_1$ to $CKM\_PH_N$ at a frequency that is M-times the frequency of the reference clock signal $CK_{REF}$, the clock generation circuit 100 may be considered to have entered or transitioned from the frequency adjustment state into a frequency locked state or phase of operation.

Any or all of the outputs of the delay cells DB(1) to DB(N) may be outputs of the clock generation circuit 100. Accordingly, any or all of the outputs of the delay cells DB(1) to DB(N) may be output to other electronic devices, circuits, or circuit components that may utilize one or more of the clock signals $CKM\_PH_1$ to $CKM\_PH_N$ for use as clock signals to perform their respective functions and/or operations. The frequency that is M-times the frequency of the reference clock signal $CK_{REF}$ may be a final or target frequency of the clock signals $CKM\_PH_1$ to $CKM\_PH_N$. Accordingly, when the clock generation circuit 100 enters into the frequency locked state, the electronic devices, circuits, or circuit components receiving the clock signals $CKM\_PH_1$ to $CKM\_PH_N$ may utilize them while they are generated at their final or target frequencies.

Additionally, while the clock generation circuit 100 is in the frequency locked state, at some point, the clock generation circuit 100 may stop receiving the reference clock signal $CK_{REF}$ from the external source. Any of various reasons that the external source no longer sends the reference clock signal $CK_{REF}$ to the clock generation circuit 100 may be possible. For example, the clock generation circuit 100 may be a component of an electronic device that communicates with the external source. The external source may send the reference clock signal $CK_{REF}$ to the electronic device during limited periods of operation, such as when the external source wants to communicate data or other information with the electronic device. Outside of these periods, the external source may not supply the reference clock signal $CK_{REF}$ to the electronic device. The electronic device, however, may have other operations or functions to perform outside of these limited periods, for which it may need one or more clock signals.

While the clock generation circuit 100 is in the frequency locked state, if the reference clock signal $CK_{REF}$ stops being received from the external source, the first delay chain may continue to generate the clock signals $CKM\_PH_1$ to $CKM\_PH_N$ at a frequency of M-times the reference clock frequency. Accordingly, the clock generation circuit 100 continues to operate as a clock generator or clock source for the other electronic devices, circuit, or circuit components that are receiving one or more of the $CKM\_PH_1$ to $CKM\_PH_N$ as their clock signals. As such, the transition from when the reference clock signal $CK_{REF}$ is being received to when it stops being received is seamless, and lost time due to the transition and/or overhead to manage the transition may be avoided.

Figure 3:
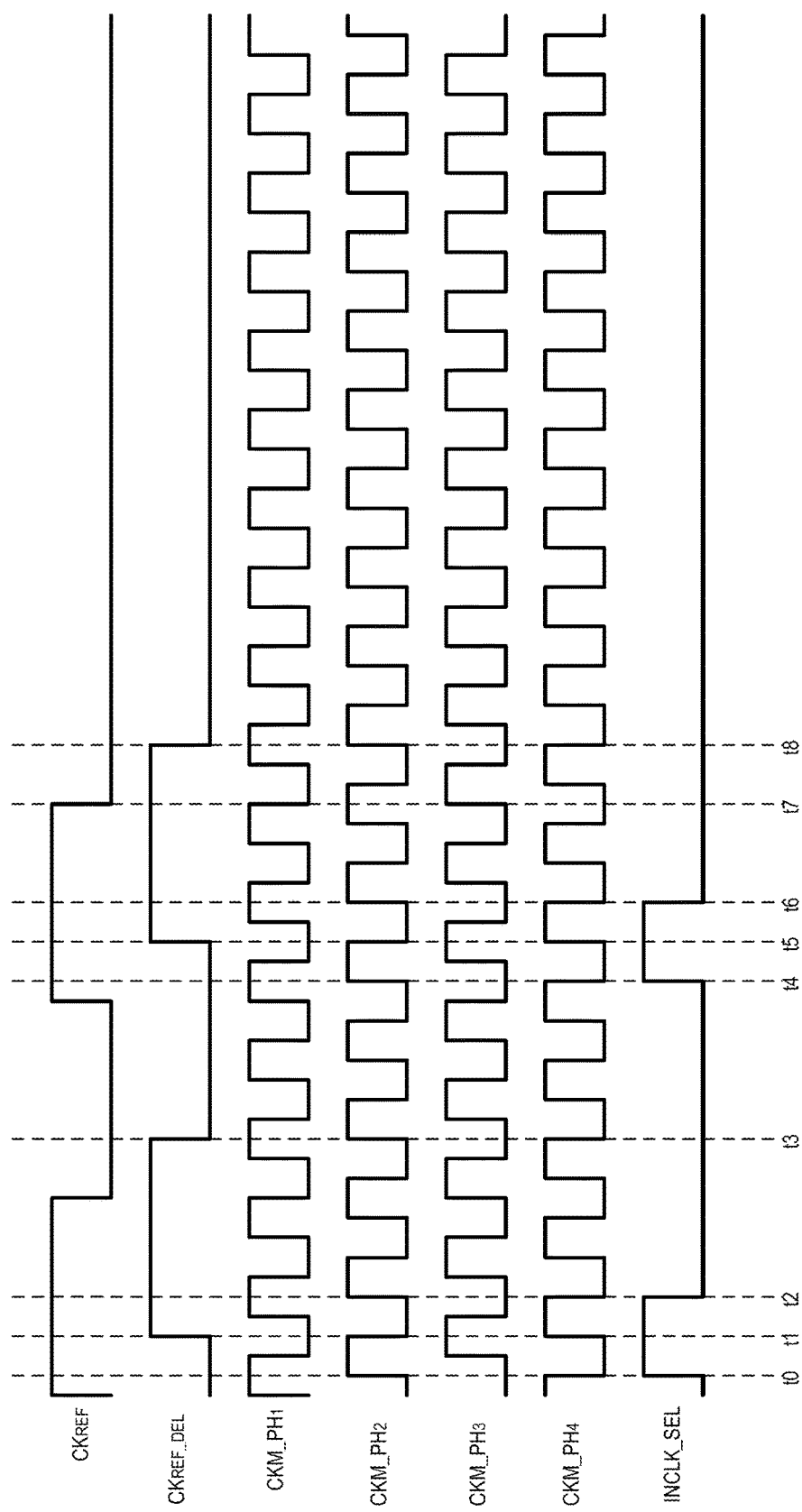
FIG. 3 is a timing diagram of example waveforms of certain signals communicated and/or generated with the clock generation circuit of FIG. 1.

FIG. 3 shows a timing diagram of example waveforms of certain signals communicated and/or generated with the clock generation circuit 100. The waveforms are shown for a particular configuration of the clock generation circuit 100 where the number of delay cells the first delay chain is 4 (i.e., N=4), and the delay cells of the first delay chain are configured to generate four clock signals CKM_PH1, CKM_PH2, CKM_PH3, CKM_PH4 at five-times the frequency of the reference clock signal $CK_{REF}$ (i.e., M=5). FIG. 3 shows the example waveforms of the reference clock signal $CK_{REF}$, the delayed reference clock signal $CK_{REF\_DEL}$, the four clock signals CKM_PH1, CKM_PH2, CKM_PH3, CKM_PH4, and the input select signal INCLK_SEL.

The example waveforms shown in FIG. 3 illustrate the signals as they may be propagating while the clock generation circuit 100 is in the frequency locked state. As shown in FIG. 3, each of the four clock signals CKM_PH1, CKM_PH2, CKM_PH3, CKM_PH4 are shown as being generated at 5-times the frequency of the reference clock signal $CK_{REF}$. Also, the rising and falling edges of the Nth clock signal CKM_PH4 are aligned with the rising and falling edges of the delayed reference clock signal $CK_{REF\_DEL}$. The edge alignments are shown in FIG. 3 with respect to times t1, t3, t5, and t8. As previously described, such edge alignment may indicate to the delay control generator module 202 not to adjust the delay control signal DelCmd from its current value or level.

The example waveforms shown in FIG. 3 also illustrate the clock signals CKM_PH1, CKM_PH2, CKM_PH3, CKM_PH4 being delayed and correspondingly phase shifted 90 degrees relative to each other. For example, the second clock signal CKM_PH2 is delayed and correspondingly phase shifted 90 degrees relative to the first clock signal CKM_PH1, the third clock signal CKM_PH2 is delayed and correspondingly phase shifted 90 degrees relative to the second clock signal CKM_PH2 and 180 degrees relative to the first clock signal CKM_PH1, and the fourth clock signal CKM_PH4 is delayed and correspondingly phase shifted 90 degrees relative to the third clock signal CKM_PH3, 180 degrees relative to the second clock signal CKM_PH2, and 270 degrees relative to the first clock signal CKM_PH1. The 90 degree phase shift among the four clock signals CKM_PH1, CKM_PH2, CKM_PH3, CKM_PH4 illustrates a general aspect that the delay amount for the delay cells DB(1) to DB(N) of the first delay chain as well as the delay cells DA(1) to DA(N/2+1) of the second delay chain will be equal or about equal to 360/N. In other words, the signal input into the first delay cell DB(1) of the first delay chain will be phase shifted 360 degrees after being phase shifted by the Nth (last) delay cell DB(N). In this context, FIG. 3 shows the delayed reference clock signal $CK_{REF\_DEL}$ being delayed and correspondingly phase shifted 270 degrees relative to the reference clock signal $CK_{REF}$ with reference to the frequency or rate of the clock signals CKM_PH1, CKM_PH2, CKM_PH3, CKM_PH4 output by the first delay chain.

Further, the example waveforms in FIG. 3 show the clock generation circuit 100 receiving the reference clock signal $CK_{REF}$ during a time period extending from time t0 to time t7. During this time period, the output of the logic gate 104 may supply the clock select signal INCLK_SEL to the select input of the input multiplexer 102. This is illustrated in FIG. 3, where a first pulse of the clock select signal INCLK_SEL occurs from time t0 to time t2, and a second pulse of the clock select signal INCLK_SEL occurs from time t4 to time t6. The time periods extending from time t0 to time t2 and from time t4 to time t6 also denote the comparison windows during which the delay control generator 202 may compare the phases of the Nth clock signal $CKM\_PH_N$ and the delayed reference clock signal $CK_{REF\_DEL}$. In addition, FIG. 3 shows the pulse widths of each of the first and second pulses being about one period of the (N/2)th clock signal CKM_PH2. Also, FIG. 3 shows the second pulse occurring on the next fifth cycle of the (N/2)th clock signal CKM_PH2. However, FIG. 3 does not show a third pulse of the clock select signal INCLK_SEL occurring at a next fifth pulse following the second pulse since the third pulse would occur after time t7 when the clock generation circuit 100 is no longer receiving the reference clock signal $CK_{REF}$.

FIG. 3 further illustrates that despite the clock generation circuit 100 no longer receiving the reference clock signal $CK_{REF}$ after time t7, the first delay chain may continue to generate the four clock signals CKM_PH1, CKM_PH2, CKM_PH3, CKM_PH4. Accordingly, despite a transition point when clock generation circuit stops receiving the reference clock signal $CK_{REF}$, such as time t7, the first delay chain may continue to generate the four clock signals CKM_PH1, CKM_PH2, CKM_PH3, CKM_PH4 seamlessly. Accordingly, the electronic devices, circuits, or circuit components that are receiving one or more of the clock signals CKM_PH1, CKM_PH2, CKM_PH3, CKM_PH4 as their clock signals may not notice or experience a problem or delay when the clock generation circuit 100 stops receiving the reference clock signal $CK_{REF}$.

Figure 4:
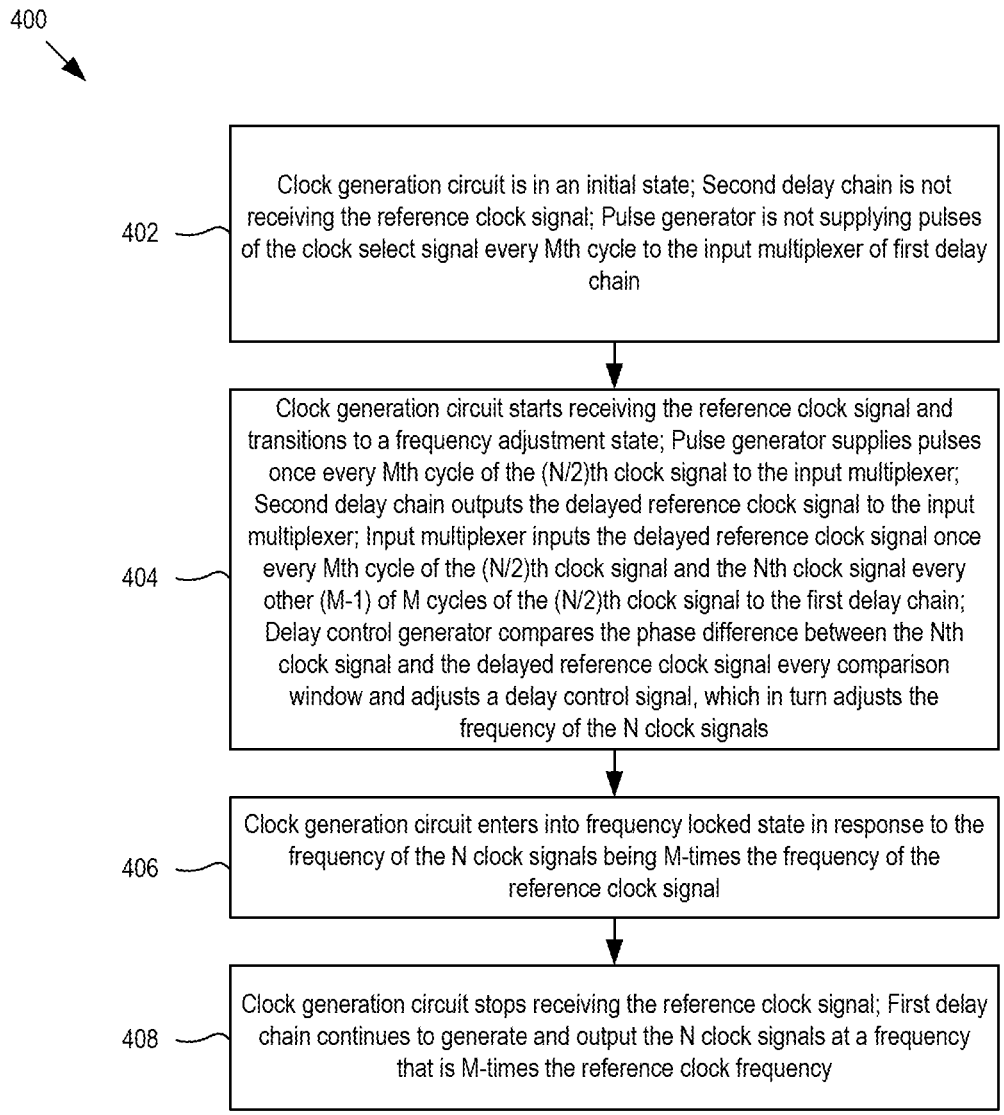
FIG. 4 is a flow chart of an example method of generating an N-number of clock signals with the example clock generation circuit of FIG. 1.

FIG. 4 shows a flow chart of an example method 400 of generating an N-number of clock signals $CKM\_PH_1$ to $CKM\_PH_N$. The example method 400 is described with reference to the example circuit generation circuit 100 shown in FIG. 1 and the generate control generator 202 and the controller 204 shown in FIG. 2, although other, similar methods may be performed using circuit components other than the ones shown in FIG. 1 and/or FIG. 2.

At block 402, during an initial period of operation, the clock generation circuit 100 may enter into and/or be in an initial state or phase of operation, where the clock generation circuit 100 has not yet received the reference clock signal $CK_{REF}$. In response, the first delay chain may not be generating the clock signals $CKM\_PH_1$ to $CKM\_PH_N$, and the logic gate 104 may output the clock select signal INCLK_SEL at a low level. Also, during the initial period of operation, the controller 204 may have determined the M-value and set the divide-by-M control signals div_by 1 to div_by_P to appropriate levels corresponding to the determined M-value.

At block 404, the clock generation circuit 100 may begin receiving the reference clock signal $CK_{REF}$ and transition from the initial state to the frequency adjustment state. While the reference clock signal $CK_{REF}$ is being received, the pulse generator, such as the logic gate 104 of the pulse generator, may supply a pulse of the clock select signal INCLK_SEL once every M cycles of the (N/2) clock signal $CKM\_PH_{N/2}$ to the input multiplexer 102. Also, the second delay chain may supply the delayed reference clock signal $CK_{REF\_DEL}$ to the input multiplexer 102.

The input multiplexer 102 may respond to each pulse of the clock select signal INCLK_SEL by outputting the delayed reference clock signal $CK_{REF\_DEL}$ to the first delay cell DB(1) instead of the Nth clock signal $CKM\_PH_N$. Accordingly, during every Mth cycle of the (N/2)th clock signal $CKM\_PH_{N/2}$, the input multiplexer 102 inputs or injects the delayed reference clock signal $CK_{REF\_DEL}$ into the first delay chain. Conversely, during the other (M−1) of every M cycles of the (N/2)th clock signal $CKM\_PH_{N/2}$, the output clock signal $CKM\_PH_N$ of the Nth (last) delay cell DB(N) is fed back and input into the beginning of the first delay chain.

In addition, during the frequency adjustment state at block 404, the delay control generator 202 may receive both the Nth clock signal $CKM\_PH_N$ and the delayed reference clock signal $CK_{REF\_DEL}$. During comparison windows occurring during the pulses of the clock select signal INCLK_SEL, the delay control generator 202 may determine or measure a phase difference between the Nth $CKM\_PH_N$ and the delayed reference clock signal $CK_{REF\_DEL}$, and adjust a level or value of the delay control signal DelCmd in response to the determined phase difference. The adjustment of the level or value of the delay control signal DelCmd may, in turn, cause the first delay chain to correspondingly adjust the frequency of the clock signals $CKM\_PH_1$ to $CKM\_PH_N$ from an initial frequency that matches the frequency of the reference clock signal $CK_{REF}$ to a frequency multiple that is M-times the frequency of the reference clock signal $CK_{REF}$.

At block 406, the clock generation circuit 100 may transition into the frequency locked state, where the frequency at which the delay cells DB(1) to DB(N) are generating the clock signals $CKM\_PH_1$ to $CKM\_PH_N$ is locked or is constant at M-times the frequency of the reference clock signal $CK_{REF}$. At this point, the edges of the delayed reference clock signal $CK_{REF\_DEL}$ and the Nth clock signal $CKM\_PH_N$ may be aligned. The delayed reference clock signal $CK_{REF\_DEL}$ and the Nth clock signal $CKM\_PH_N$ may be in phase with each other. In response, the delay control generator 202 may determine not to further adjust the delay control signal DelCmd in response to receipt of the delayed reference clock signal $CK_{REF\_DEL}$ and the Nth clock signal $CKM\_PH_N$.

As previously described, any or all of the outputs of the delay cells DB(1) to DB(N) may be outputs of the clock generation circuit 100. Accordingly, when the clock generation circuit 100 enters into the frequency locked state, electronic devices, circuits, or circuit components receiving the clock signals $CKM\_PH_1$ to $CKM\_PH_N$ may utilize them while they are generated at final or target frequencies of M-times the reference clock frequency.

At block 408, while the clock generation circuit 100 is in the frequency locked state, the clock generation circuit 100 may stop receiving the reference clock signal $CK_{REF}$. However, the clock generation circuit 100 may continue to operate as a clock generator or clock source for the other electronic devices, circuit, or circuit components that are receiving one or more of the $CKM\_PH_1$ to $CKM\_PH_N$ as their clock signals. As such, the transition from when the reference clock signal $CK_{REF}$ is being received to when it stops being received is seamless, and lost time due to the transition and/or overhead to manage the transition may be avoided.

Figure 5:
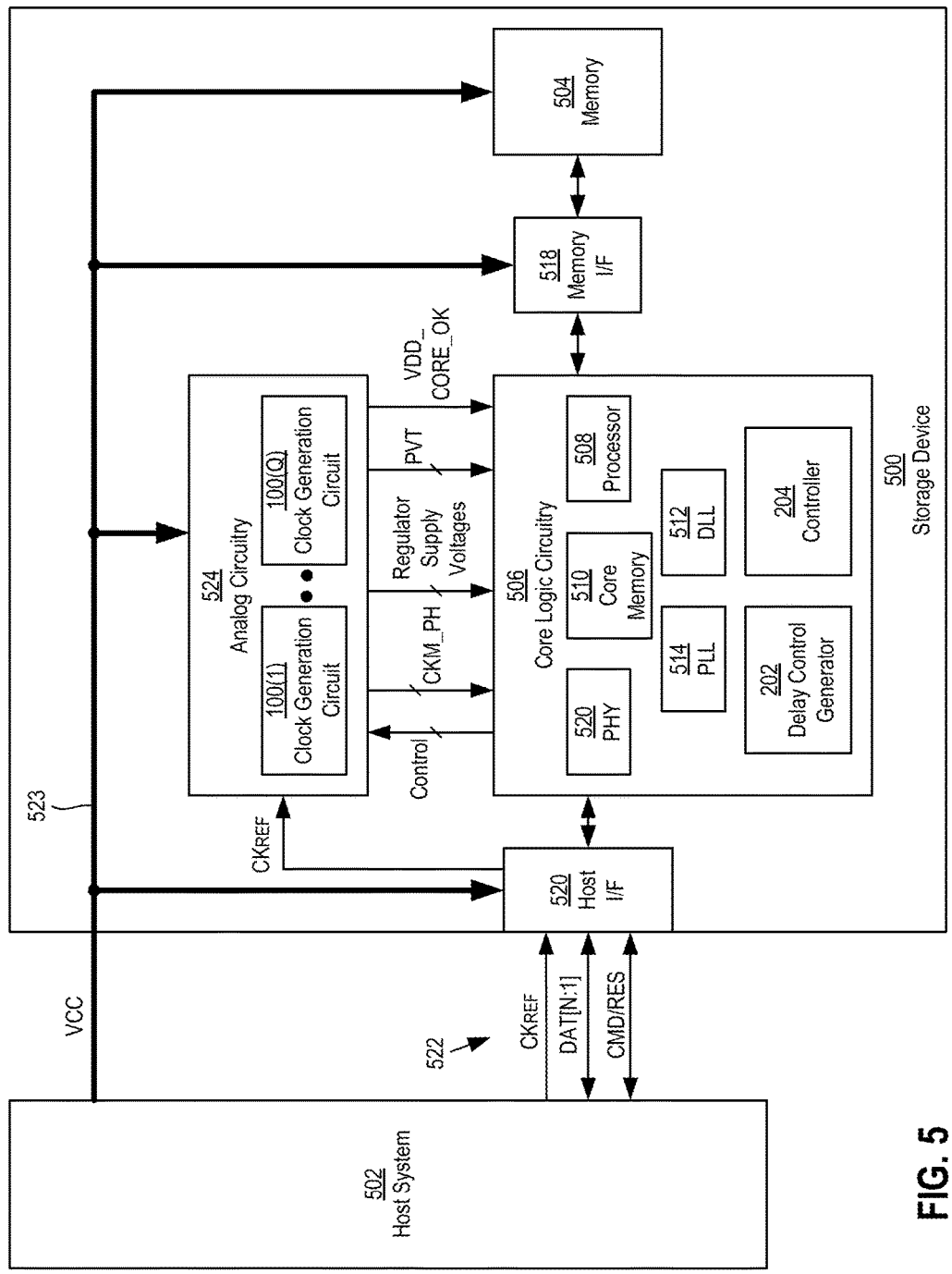
FIG. 5 is a block diagram of an example memory system configured to implement the example clock generation circuit of FIG. 1, and the delay control generator and the controller of FIG. 2 and perform the method of FIG. 4.

FIG. 5 shows a block diagram of an example storage device 500 that may be configured to include a Q-number of the clock generation circuits 100(1) to 100(Q), (Q being one or more) of FIG. 1, the delay control generator module 202 and the controller module 204 of FIG. 2, and perform the example method 400 of FIG. 4. More than one clock generation circuit 100 may be used where it is desirable or necessary for multiple clock signals with different frequencies, such as different multiples of the reference clock signal $CK_{REF}$, to be generated and supplied simultaneously to various components of the storage device 500.

The storage device 500 may be configured to be connected to and/or in communication with a host system 502. The host system 502 may be any electronic system or device that is configured to communicate and/or operate with the storage device 500.

In addition, the storage device 500 may include memory 504. Any suitable type of memory can be used. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in they direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

The storage device 500 may also include core logic circuitry 506. The core logic circuitry 506 may include a processor or processing circuitry 508, which may be configured to perform memory management functions of the core logic circuitry 506. Non-limiting example memory management functions may include, but not limited to, communicating with the host system 502, including receiving, handling, and responding to host requests or commands, such as read, write, erase, and status requests/commands received from the host system 502; error detection and correction (which may be part of handling host requests/commands); formatting the memory 504 to ensure it is operating properly; mapping out bad memory cells; allocating spare cells to be substituted for future failed cells; wear leveling (distributing writes to avoid wearing out specific blocks of memory that would otherwise be repeatedly written to); garbage collection (after a block is full, moving only the valid pages of data to a new block, so the full block can be erased and reused); folding operations (moving data from a lower density memory area to a higher density memory area of the memory 504); and transitioning the storage device 500 between different states, operation modes, and/or power consumption modes. In operation, when the host system 502 needs to read data from or write data to the memory 504, it may communicate with the processing circuitry 508. The processing circuitry 508 may include hardware or a combination of hardware and software. For example, the processing circuitry 508 may include a central processing unit, an application specific integrated circuit (ASIC), a field programmable gate array (FPGA), a digital logic circuit, an analog circuit, a combination of discrete circuits, gates, or any other type of hardware, or a combination thereof.

The core logic circuitry 506 may also include core memory 510, which may include volatile memory (e.g., random access memory (RAM)), non-volatile memory (e.g., read-only memory (ROM)), or a combination thereof. The core memory 510 may store software or firmware instructions and/or certain data structures, such as address translation data structures, that the processing circuitry 508 may access and/or execute to perform at least some of its memory management functions. Additionally, the core memory 510 may temporarily store data that is to be transferred to and stored in the memory 504 such as in response to a host write command, and/or that was retrieved from the memory 504 and is to be sent to the host system 502, such as in response to a host read command.

The core logic circuitry 506 may also include delay-locked loop (DLL) circuitry 512, phase-locked loop (PLL) circuitry 514, and a physical layer interface (PHY) 516. The DLL circuitry 512 may be used for clocking to transfer data between the memory 504 and a memory interface 518. The PLL circuitry 514 may generate different clocks with different clock rates or frequencies for components of the processing circuitry 508 that operate in different clock domains. The physical layer interface 516 may provide an electrical interface between a host interface 520 and the processing circuitry 508. Also, as shown in FIG. 5, the delay control generator 202 and the controller 204 of FIG. 2 are shown as being components of the core logic circuitry 506. FIG. 5 shows the delay control generator 202 and the controller 204 as being separate components, although in other example configurations, the delay control generator 202 and/or the controller 204 may be components of the processing circuitry 508. In still other example configurations, the delay control generator 202 and/or the controller 204 may be components that are separate from the core logic circuitry 506. Other components of the core logic circuitry 506 may be possible.

The memory interface (I/F) 518 may provide an interface between the core logic circuitry 506 and the memory 504. The core logic circuitry 506 may be configured to communicate data and commands with the memory 504 via the memory interface 518 to store data in and/or read data from the memory 518. The host interface 520 may communicate with the host system 502. The host interface 520 may be coupled to a communications bus 522 on which the host interface 520 sends and receives signals to and from the host system 502. The host interface 520 may include driver circuitry configured to generate the signals, such as by pulling up to a high level and pulling down to a low level voltages on the lines of the communications bus 522.

The communications bus 522 may include a host clock line on which the host system 502 may send a host clock signal $CK_{REF}$ to the storage device 500. In this context, the host system 502 may be the external source and the host clock signal $CK_{REF}$ may be the reference clock signal $CK_{REF}$ that is received by the Q-number of clock generation circuits 100(1) to 100(Q) to generate their respective clock signals. The communications bus 522 may further include an N-number of data lines on which the host system 502 and the storage device 500 may communicate an N-number of data signals DAT[N:1] with each other; and a command line on which the host system 502 and the storage device 500 may communicate command signals CMD and responses RES with each other. The data signals DAT[N:1] may include data that the host system 502 wants stored in or read from the storage device 500. Command signals sent from the host system 502 may instruct or request that the storage device 500 perform some action, such as perform an operation, transition into a certain state, or respond with requested information, as examples. The response signals sent from the storage device 500 may acknowledge receipt of the command signals, indicate that the instructed/action is performed, or include the requested information, as examples. The host system 502 may also supply one or more power supply voltages VCC on one or more supply lines 523 to power the components of the storage device 500.

The storage device 500 may further include analog circuitry 524. At least a portion of the analog circuitry 524 may include the Q-number of clock generation circuits 100(1) to 100(Q). The clock generation circuits 100(1) to 100(Q) may be configured to receive the host/reference clock signal $CK_{REF}$ from the host system 502 via the host interface 520, and in response, generate and output one or more clock signals CKM_PH. The clock generation circuit(s) 100(1) to 100(Q) may output the one or more clock signals CKM_PH to the various components of the core logic circuitry 506.

The analog circuitry 524 may further be configured to perform certain other functions, such as provide a plurality of regulator supply voltages to the core logic circuitry 506, including a core supply voltage. In addition, the analog circuitry 524 may provide one or more process-voltage-temperature (PVT) signals, and a core voltage stabilization signal VDD_CORE_OK indicating whether the core supply voltage is at a stable level. The core logic circuitry 506 may be configured to send one or more control signals to the analog circuitry 524 to configure, program, enable, and/or disable various components of the analog circuitry 524. The delay control signal DelCmd, divided-by-M control signals, and the reset signal DLL_RST may be part of these control signals communicated from the control logic circuitry 506 to the analog circuitry 524.

The host system 502 may be configured to send the reference clock signal $CK_{REF}$ during limited time periods or portions of operation. For example, the host system 502 may be communicate the reference clock signal $CK_{REF}$ while it is communicating data signals DAT[N:1] on the data lines and/or commands CMD and responses RES on the command lines. There may be situations or periods of operation where the storage device 500 may utilize a clock signal outside of the limited periods that the host system 502 is sending the reference clock signal $CK_{REF}$ on the clock line of the communications bus 522. For example, as described above, communicating with the host system 502 is only one of several memory management functions that the processing circuitry 508 is configured to perform. There are several other memory management functions, non-limiting examples of which are listed above, where the storage device 500 may want to utilize one or more clock signals, including ones having a frequency that is M-times or a frequency-multiple of the frequency of the reference clock signal $CK_{REF}$. Accordingly, through utilization of the Q-number of clock generation circuits 100(1) to 100(Q), the storage device 500 may be configured to generate clock signals CKM_PH for its components despite no longer receiving the reference clock signal $CK_{REF}$ from the host system 502. As explained above, when the host system 502 stops supplying the reference clock signal $CK_{REF}$, the Q-number of clock generation circuits 100(1) to 100(Q) may continue to generate the clock signal(s) CKM_PH and supply the clock signal(s) to the various circuit components within the storage device 500. The clock generation circuits 100(1) to 100(Q) may do so seamlessly when the host system 502 stops supplying the reference clock signal $CK_{REF}$ such that the transition point at which the host system 502 stops supplying the reference clock signal $CK_{REF}$ is unnoticeable or unrecognizable.

The example clock generation circuit 100, the delay control generator 202, and the controller 204 are not limited to memory systems, such as the storage device 500 of FIG. 5, and may be applicable for any devices or apparatuses, including those not specific to memory applications, that receive a clock signal from an external source to operate, especially those that want to continue to operate using a clock signal even though it is no longer receiving a clock signal from the external source.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

We claim:

1. A clock generation circuit comprising:
   a pulse generator configured to receive a reference clock signal and generate pulses of a select signal at a rate corresponding to once every M-number of cycles; and
   a delay chain configured to:
      alternatingly receive a delayed version of the reference clock signal and a last clock signal output from the delay chain according to the pulses of the select signal; and
      generate a clock signal at a frequency multiple of M-times a frequency of the delayed reference clock signal in response to alternating receipt of the delayed reference clock signal and the last clock signal,
   wherein the pulse generator comprises an output circuit that is configured to prevent the pulse generator from outputting the pulses of the select signal in response to the reference clock signal not being received.

2. The clock generation circuit of claim 1, wherein the delay chain comprises a first delay chain comprising an N-number of delay cells, wherein the clock generation circuit further comprises:
   a second delay chain comprising an (N/2+1)-number of delay cells, wherein the second delay chain is configured to receive the reference clock signal and generate the delayed reference clock signal in response to receipt of the reference clock signal.

3. The clock generation circuit of claim 1, further comprising:
   a multiplexer configured to alternatingly output the delayed reference clock signal and the last clock signal output from the delay chain to a first delay cell of the delay chain according to the pulses of the select signal.

4. The clock generation circuit of claim 3, wherein the multiplexer is further configured to:
   receive the pulses of the select signal at a rate corresponding to once every M-number of cycles of the last clock signal output from the delay chain.

5. The clock generation circuit of claim 4, wherein the multiplexer is configured to:
   output the delayed reference clock signal to the first delay cell in response to receipt of the pulses; and
   output the last clock signal to the first delay cell during other times that the pulses are not received.

6. The clock generation circuit of claim 1, wherein the delay chain comprises an N-number of delay cells, and wherein the pulse generator is configured to:
   receive an (N/2)th clock signal generated with the delay chain; and
   generate the pulses of the select signal once every Mth cycle of the (N/2)th clock signal.

7. The clock generation circuit of claim 1, further comprising:
   a delay control generator configured to:
      determine a phase delay between the delayed reference clock signal and the last clock signal during comparison windows corresponding to the pulses of the select signal; and
      generate a delay control signal to set a delay amount of delay cells of the delay chain in response to the determine phase delay.

8. A system comprising:
a delay chain; and
a delay control generator circuit,
wherein the delay control generator circuit is configured to:
   determine a phase difference between a delayed reference clock signal and a clock signal output from the delay chain during each of a plurality of comparison windows, the plurality of comparison windows occurring at a rate corresponding to once every M-number of cycles of the clock signal;
   set a delay control signal in response to the determine phase difference; and
   output the delay control signal to the delay chain to set a delay of delay cells of the delay chain, and
wherein the delay chain is configured to generate the clock signal at a frequency that is M-times the rate of the delayed reference clock signal in response to receipt of the delay control signal.

9. The system of claim 8, wherein the delay chain comprises a first delay chain comprising an N-number of delay cells, wherein the system further comprises:
a second delay chain comprising a (N/2+1)-number of delay cells, wherein the second delay chain is configured to receive a reference clock signal and generate the delayed reference clock signal in response to receipt of the clock signal.

10. The system of claim 9, wherein the delay control generator circuit is further configured to output the delay control signal to set a delay of delay cells of the second delay chain.

11. The system of claim 8, further comprising:
a multiplexer configured to alternatingly output the delayed reference clock signal and the clock signal to a first delay cell of the delay chain according to pulses of a select signal, the pulses occurring at the rate corresponding to once every M-number of cycles of the clock signal.

12. The system of claim 11, wherein the multiplexer is configured to:
output the delayed reference clock signal to the first delay cell in response to receive of the pulses; and
output the clock signal to the first delay cell during other times that the pulses are not received.

13. The system of claim 11, further comprising a pulse generator configured to generate
the select signal,
   wherein the delay chain comprises an N-number of delay cells, wherein an (N/2) delay cell of the N-number of delay cells is configured to generate an (N/2)th clock signal, and
   wherein the pulse generator is configured to generate the pulses of the select signal once every Mth cycle of the (N/2) clock signal.

14. An apparatus comprising:
an interface configured to receive an external clock signal at an external clock frequency from an external source; and
a delay chain configured to:
   generate a plurality of clock signals at an initial frequency, wherein the initial frequency matches the external clock frequency;
   in response to receipt of the external clock signal:
      selectively receive a delayed external clock signal and one of the plurality of clock signals;
      in response to the selective receipt, adjust a frequency of the plurality of clock signals from the initial frequency to a frequency multiple of the external clock frequency; and
   continue to generate the plurality of clock signals at the frequency multiple of the external clock frequency in response to the interface no longer receiving the external clock signal.

15. The apparatus of claim 14, further comprising:
a multiplexer configured to:
   receive the delayed external clock signal and the one of the plurality of clock signals;
   receive a select signal comprising pulses occurring at a rate corresponding to once every M-number of cycles of the plurality of clock signals;
   output the delayed external clock signal to the delay chain in response to receipt of the pulses; and
   output the one of the plurality of clock signals to the delay chain during other times that the pulses are not received.

16. The apparatus of claim 15, wherein the delay chain comprises a first delay chain comprising an N-number of delay cells, wherein the apparatus further comprises:
a second delay chain comprising an (N/2+1)-number of delay cells,
wherein a first delay cell of the (N/2+1)-number of delay cells is configured to receive the external clock signal, and wherein a (N/2+1)th delay cell of the (N/2+1)-number of delay cells is configured to output the delayed external clock signal to the multiplexer.

17. The apparatus of claim 16, further comprising:
a delay control generator circuit configured to determine a phase difference between the delayed external clock signal and the one of the plurality of clock signals during each a plurality of comparison windows, the plurality of comparison windows occurring at a rate corresponding to once every M-number of cycles of plurality of clock signals.

* * * * *